United States Patent
Gang

(10) Patent No.: US 6,429,508 B1
(45) Date of Patent: Aug. 6, 2002

(54) SEMICONDUCTOR PACKAGE HAVING IMPLANTABLE CONDUCTIVE LANDS AND METHOD FOR MANUFACTURING THE SAME

(75) Inventor: Heung-su Gang, Seoul (KR)

(73) Assignee: Kostat Semiconductor Co., Ltd., Seoul (KR)

( * ) Notice: Subject to any disclaimer, the term of this patent is extended or adjusted under 35 U.S.C. 154(b) by 0 days.

(21) Appl. No.: 09/677,598

(22) Filed: Oct. 3, 2000

(30) Foreign Application Priority Data

Aug. 9, 2000 (KR) .............................. 00-46164

(51) Int. Cl.⁷ .............................................. H01L 23/02
(52) U.S. Cl. ...................... 257/678; 257/676; 257/778; 257/787; 438/112
(58) Field of Search ................. 257/778, 676, 257/678, 787; 438/112

(56) References Cited

U.S. PATENT DOCUMENTS

| | | | |
|---|---|---|---|
| 5,969,426 A | 10/1999 | Baba et al. | 257/778 |
| 6,215,179 B1 | 4/2001 | Ohgiyama | 257/676 |
| 6,247,229 B1 | 6/2001 | Glenn | |
| 6,278,177 B1 | 8/2001 | Ryu | 257/678 |
| 6,294,830 B1 | 9/2001 | Fjelstad | |
| 6,309,909 B1 | 10/2001 | Hgiyama | 438/112 |

*Primary Examiner*—David Nelms
*Assistant Examiner*—Mai-Huong Tran
(74) *Attorney, Agent, or Firm*—Rothwell, Figg, Ernst & Manbeck

(57) ABSTRACT

A semiconductor package having implantable conductive lands for simplifying the manufacture of the semiconductor package, reducing the manufacturing cost by reducing the price of raw materials and improving the electrical, thermal and mechanical performance of the semiconductor package, and a method for manufacturing the same are provided. The semiconductor package includes a semiconductor package body and implantable conductive lands fixed in the semiconductor package body and taken off a tape film serving as a substrate of the semiconductor package until a molding process is completed. The tape film that has served as the substrate is taken off and removed from the semiconductor package body after the molding process so that the semiconductor package body does not include a substrate therewithin.

14 Claims, 20 Drawing Sheets

SEMICONDUCTOR PACKAGE HAVING IMPLANTABLE CONDUCTIVE LANDS AND METHOD FOR MANUFACTURING THE SAME

BACKGROUND OF THE INVENTION

1. Field of the Invention

The present invention relates to a semiconductor package and a method for manufacturing the same, and more particularly, to a chip scale package (CSP) which does not include a lead or uses a solder ball instead of a lead.

2. Description of the Related Art

Recently, electronic products such as personal computers, cellular phones and camcorders have became smaller in size and larger in processing capacity. Accordingly, a semiconductor package which is small in size, large in capacity and compliant with a fast processing speed is required. Therefore, semiconductor packages have been transformed from an insertional mounting type including a dual in-line package (DIP) into a surface mounting type including a thin small out-line package (TSOP), a thin quad flat package (TQFP) and a ball grid array (BGA).

The BGA, among the surface mounting types, has attracted considerable attention since allows the size and the weight of a semiconductor package to be greatly reduced and relatively high quality and reliability to be achieved among chip scale packages.

FIGS. 1 through 3 are views illustrating the structure of a conventional BGA package using a rigid substrate. FIG. 1 is a sectional view of the conventional BGA package using a rigid substrate. FIG. 2 is a partially cut-away plan view of the conventional BGA package. FIG. 3 is a bottom view of the conventional BGA package.

Referring to FIGS. 1 through 3, in a typical BGA package, a semiconductor package is assembled using a rigid substrate 10 instead of a lead frame. In other words, a semiconductor chip 6 is bonded to the surface of the rigid substrate 10 with a die-bonding epoxy 5. A bond finger 2 formed on the rigid substrate 10 is connected to a bond pad of the semiconductor chip 6 using a gold wire 4. After completing wire bonding, the rigid substrate 10 and the semiconductor chip 6 are molded with an epoxy mold compound (EMC) which is a sealing resin 7. Thereafter, a solder ball 13, an external connecting terminal, is attached to a solder ball pad, a circuit pattern, which connects the top to the bottom in the rigid substrate 10 through a via-hole 9 formed in the rigid substrate 10.

In the drawings, reference numeral 1 denotes a solder mask formed on the front surface of the rigid substrate 10, reference numeral 3 denotes a front conductive land, reference numeral 11 denotes a rear solder mask, and reference numeral 12 denotes an insulation substrate. In FIG. 3, reference numeral 6' denotes a position to which the semiconductor chip 6 is bonded.

In a conventional BGA package using a rigid substrate, it is essential to form the via-holes 9 and the front and rear conductive lands for attachment of external connecting terminals. Since many intermediate connecting terminals are formed within a semiconductor package in such arrangement, the length of interconnection between a bond pad in a semiconductor chip and an external connecting terminal is long, thereby deteriorating the electrical conductivity of the semiconductor package.

Moreover, the front and rear solder masks 1 and 11, which are used for insulation and protection of the conductive lands on the front and rear surfaces of the rigid substrate 10, are delaminated after a semiconductor package is completely assembled, thereby decreasing the reliability of the semiconductor package.

The rigid substrate 10 necessarily includes an insulation substrate 12. The insulation substrate 12 remains within a semiconductor package after the semiconductor package is completely assembled. Accordingly, the thickness of the insulation substrate 12 within the semiconductor package restrains decrease in the thickness of a BGA package.

Besides, many other parts are packaged with a rigid substrate within a semiconductor package. Defects caused by differences between thermal expansive coefficients of many parts deteriorate the reliability of the semiconductor package.

FIGS. 4 through 6 are views illustrating the structure of a conventional BGA package using a substrate where conductive lands are formed on a tape film. FIG. 4 is a sectional view illustrating the conventional BGA package using a substrate where conductive lands are formed on a tape film. FIG. 5 is a partially cut-away plan view of FIG. 4. FIG. 6 is a bottom view of FIG. 4.

Referring to FIGS. 4 through 6, a tape film 23 on which conductive lands are formed is used instead of a rigid substrate. Conductive lands are formed on the tape film 23 which is an insulation substrate formed of a polyimide resin by performing a punching or etching process to form holes. The tape film 23 having the conductive lands is used as a base substrate in assembling a semiconductor package.

Accordingly, a front solder mask 21 and a rear solder mask 28 are formed on the tape film 23 for insulation and protection of the conductive lands. The tape film 23 including the front and rear solder masks 21 and 28 remains as part of the semiconductor package after completing the assembly of the semiconductor package.

In the drawings, reference numeral 22 denotes a bond finger, reference numeral 24 denotes gold wire, reference numeral 25 denotes a die-bonding epoxy, reference numeral 26 denotes a semiconductor chip, reference numeral 27 denotes a sealing resin, reference numeral 29 denotes a solder ball pad, and reference numeral 30 denotes a solder ball. In FIG. 6, reference numeral 26' denotes a position to which the semiconductor chip 26 is bonded.

However, a conventional BGA package using a tape film in which conductive lands are formed requires an additional process such as punching or etching for forming a hole connecting the solder pad 29 to the bond finger 22. Moreover, the tape film 23 that remains within a semiconductor package after completion of assembly of the semiconductor package hinders in decreasing the thickness of the semiconductor package. Also, various defects are caused by differences between thermal expansive coefficients of the tape film 23 and other parts packaged within the semiconductor package, thereby deteriorating the reliability of the semiconductor package.

FIGS. 7 through 9 are views illustrating the structure of a conventional quad flat no-lead (QFN) package. FIG. 7 is a sectional view of the conventional QFN package. FIG. 8 is a partially cut-away plan view of FIG. 7. FIG. 9 is a bottom view of FIG. 7.

Referring to FIGS. 7 through 9, a semiconductor chip 44 is bonded to a chip pad 50 serving as a heat sink, and to a lead frame 49 including only an internal lead 41, with a die-bonding epoxy 43, and wire bonding is performed using gold wire 42. Thereafter, the lead frame 49 and the semiconductor chip 44 are molded with a sealing resin 45 which is an EMC.

In the drawings, reference numeral 51 denotes a region where ground bonding is performed, and reference numeral 52 denotes a region where bonding of a usual input/output terminal is performed. Reference numeral 53 denotes an internal lead for an input/output terminal of a semiconductor package, and reference numeral 54 denotes an internal lead for a ground terminal.

However, for a conventional QFN package, the lead frame 49 should be formed of copper or an alloy of copper, and this lead frame 49 remains as the part of the semiconductor package after completion of assembly of the semiconductor package, thereby hindering in decreasing the thickness of the semiconductor package. Moreover, during a singulation process for taking off individual semiconductor packages from a strip of semiconductor packages, it is very difficult to take off a semiconductor package including the lead frame 49, thereby causing many defects. Besides, many internal leads 53 for input/output terminals restrict the space where they are arranged in a semiconductor package.

SUMMARY OF THE INVENTION

To solve the above problems, it is a first object of the present invention to provide a semiconductor package having implantable conductive lands for simplifying the manufacture of the semiconductor package, reducing the manufacturing cost by reducing the price of raw materials and improving the electrical, thermal and mechanical performance of the semiconductor package.

It is a second object of the present invention to provide a method for manufacturing the semiconductor package having the implantable conductive lands.

Accordingly, to achieve the first object of the invention, there is provided a semiconductor package having implantable conductive lands, including a semiconductor package body including a semiconductor chip but not including a lead frame or a substrate therewithin, the semiconductor package body formed of a sealing resin; and implantable conductive lands attached to the surface of the semiconductor package body to be exposed to the outside, each of the implantable conductive lands electrically connected to a bond pad of the semiconductor chip.

In one preferred embodiment, the implantable conductive lands are detached from a tape film serving as a substrate until a molding process is completed. The thickness of each implantable conductive land is between several $\mu$m and several mm, and the shape thereof is a tetragon or a circle.

The semiconductor package body is a ball grid array (BGA) type, a quad flat no-lead (QFN) type or a flip chip type. When the semiconductor chip is connected to the implantable conductive lands through wires, the bottom of the semiconductor chip is preferably attached to implantable conductive lands using a heat conductive die-bonding epoxy or an electrically conductive die-bonding epoxy, and a surface treatment layer for wire bonding is preferably formed on one side of each implantable conductive land attached to the semiconductor package body.

When the semiconductor package body is a BGA type or a flip chip type, external connecting terminals are preferably further formed on the sides of the implantable conductive lands which do not contact the semiconductor package body. The external connecting terminals may be formed using solder coats or solder balls.

When the semiconductor package body is a flip chip type, solder bumps for directly connecting the bond pads of the semiconductor chip to implantable conductive lands are preferably formed on the bond pads. In addition, an extended implantable conductive land formed by connecting an implantable conductive land connected to a solder bump to an implantable conductive land connected to an external connecting terminal through a wire may be used.

The implantable conductive lands include implantable conductive lands for input/output terminals, implantable conductive lands for grounding, implantable conductive lands for heat sinks and implantable conductive lands for power terminals. The implantable conductive lands for grounding and the implantable conductive lands for heat sinks can be connected to each other, and the implantable conductive lands for power terminals can be electrically connected to each other.

To achieve the second object of the invention, there is provided a method of manufacturing a semiconductor package having implantable conductive lands. In the method, a semiconductor chip is attached to a temporary substrate in which the implantable conductive lands are formed on a tape film. The bond pads of the semiconductor chip are connected to implantable conductive lands. Subsequently, the temporary substrate and the semiconductor chip are molded with a sealing resin. The tape film is detached from the molded resultant structure, leaving the implantable conductive lands in a semiconductor package body that has undergone the molding.

The method for manufacturing a semiconductor package having implantable conductive lands may be modified depending on the type of semiconductor package.

In one preferred embodiment of the present invention, the tape film is composed of a tape body substantially serving as a substrate until the molding process is completed, and an adhesive layer easily detached from the implantable conductive lands.

A surface treatment layer for the wire bonding is preferably formed on one side of each implantable conductive land, and the implantable conductive lands include implantable conductive lands for external connecting terminals and implantable conductive lands for heat sinks.

In the molding process, a liquefied molding material may be dispensed to the temporary substrate by a dispenser, or a thermosetting resin may be molded using molding equipment.

Implantable conductive lands for grounding and implantable conductive lands for heat sinks can be connected to each other, and implantable conductive lands for power terminals can be electrically connected to each other.

In another preferred embodiment, the step of detaching the tape film from the temporary substrate is performed after the molding step or after a singulation process.

According to the present invention, a semiconductor package can be assembled without using expensive material such as a tape film or rigid substrate having via-holes or a lead frame, thereby simplifying the manufacturing processes and reducing the manufacturing cost.

In addition, implantable conductive lands for heat sinks are directly attached to a semiconductor chip to be exposed to the outside, thereby improving the thermal performance of a semiconductor package. Since the electrical wiring path between a bond pad of the semiconductor chip to an external connecting terminal can be shortened, the electrical characteristics of the semiconductor package can be improved. By removing a substrate or a lead frame and a solder mask from the semiconductor package, defects caused by the difference between thermal expansive coefficients and delamination, which cause a decrease in reliability, can be restrained, and the thickness of the semiconductor package can be reduced, thereby improving the mechanical characteristics of the semiconductor package.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE PRESENT INVENTION

Hereinafter, preferred embodiments of the present invention will be described in detail with reference to the attached drawings.

In this specification, a semiconductor package body is used in the most comprehensive sense and is not restricted to a particular semiconductor package described in the following embodiments. In other words, The present invention can be applied to any type of semiconductor package which can be assembled using implantable conductive lands. The embodiments that will be set forth can be modified without departing from the spirit and essential features of the present invention. For example, the shape of an implantable conductive land is a tetragon or a circle in the preferred embodiments of the present invention, but can be modified into a different shape allowing wire bonding and attachment of an external connecting terminal. Different methods of bonding a semiconductor chip and bonding wire and molding can be substituted for the methods that will be described in the preferred embodiments below. Therefore, the preferred embodiments will be disclosed in descriptive sense only and not for the purpose of limitation.

Figure 1:
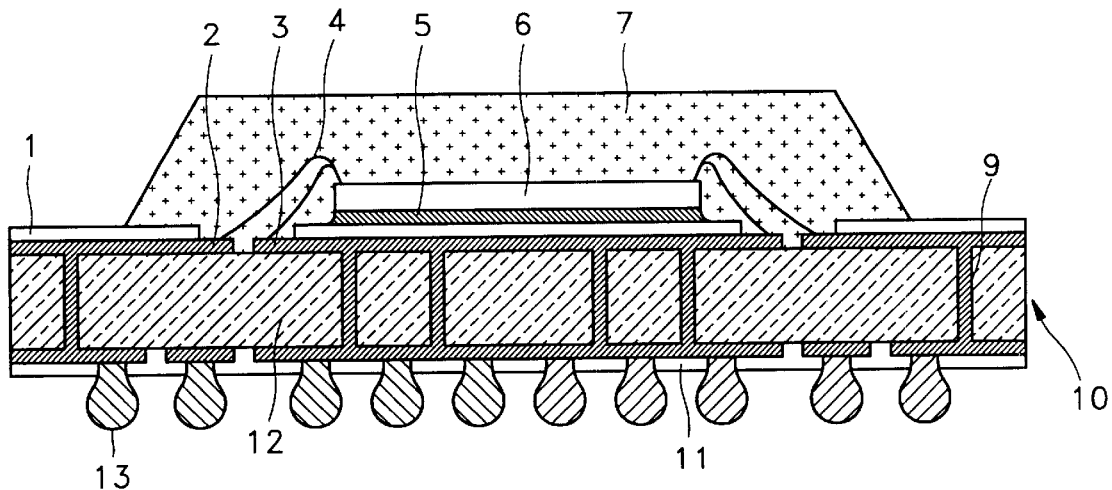
FIGS. 1 through 3 are views illustrating the structure of a conventional ball grid array (BGA) package using a rigid substrate.
Figure 2:
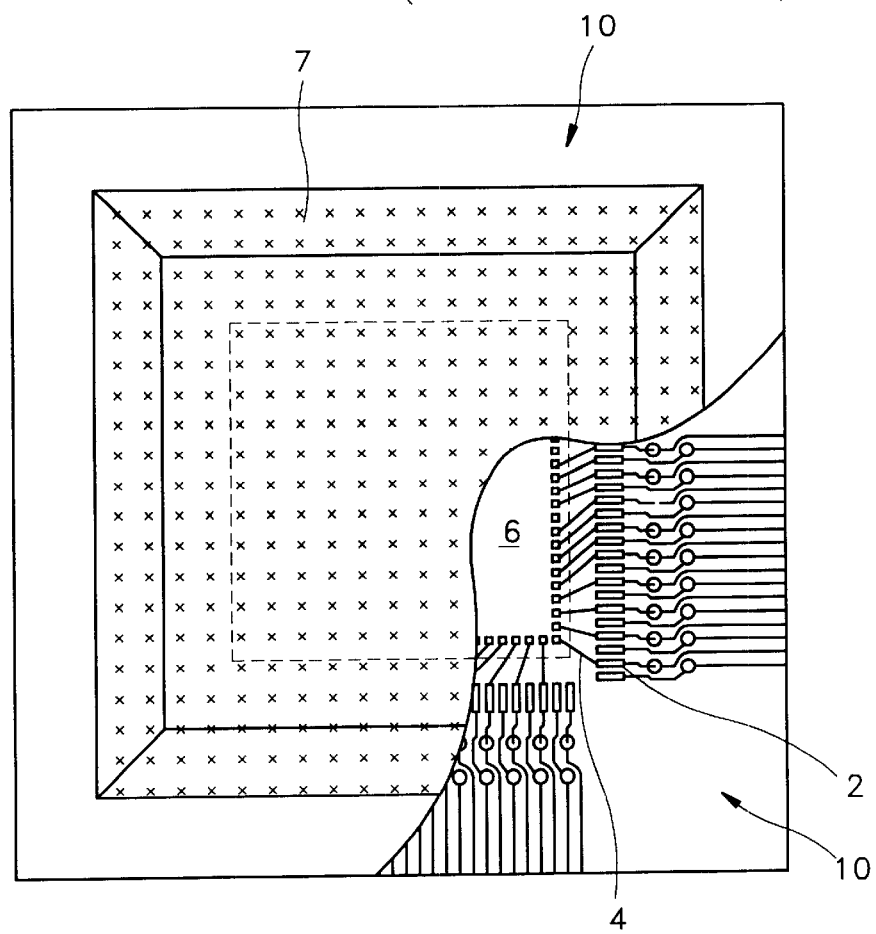
Figure 3:
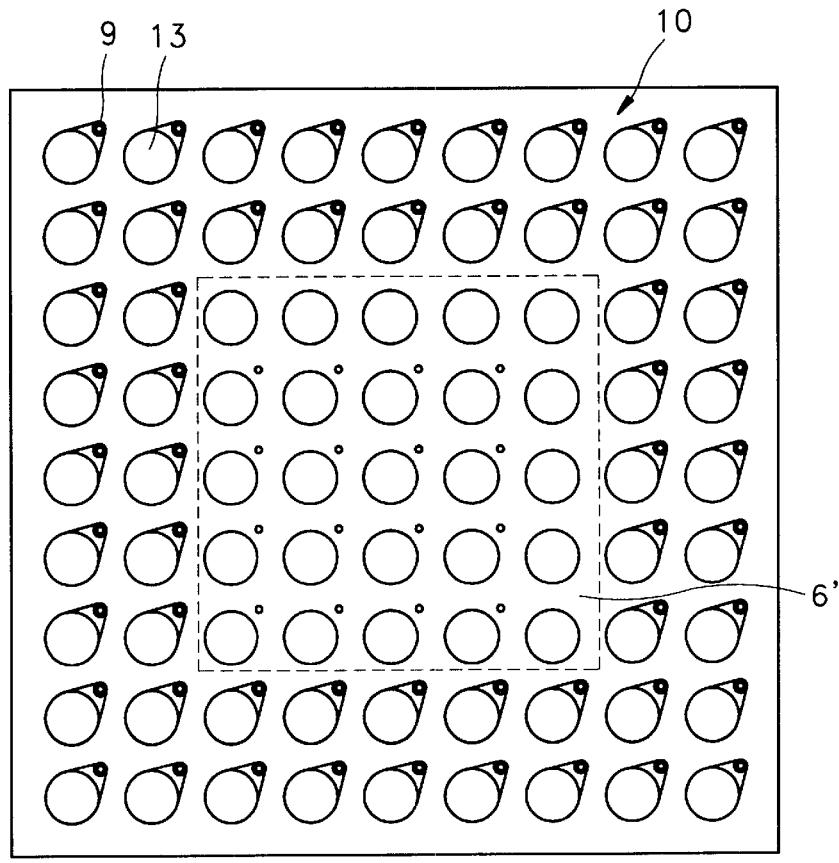
Figure 4:
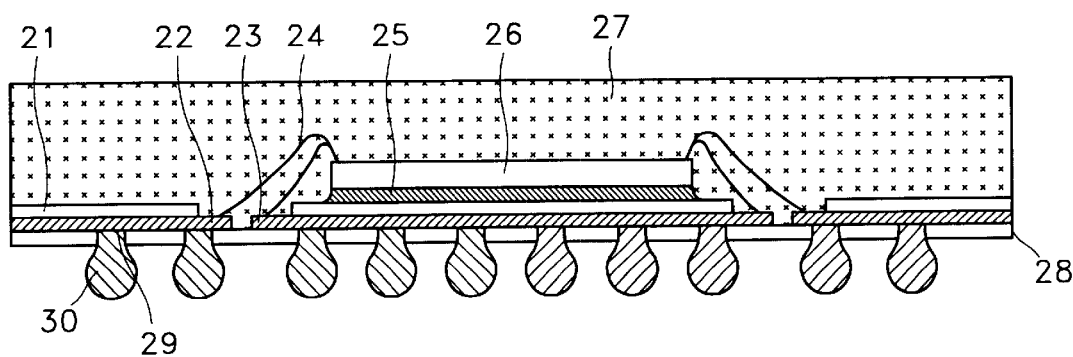
FIGS. 4 through 6 are views illustrating the structure of a conventional BGA package using a substrate where conductive lands are formed on a tape film.
Figure 5:
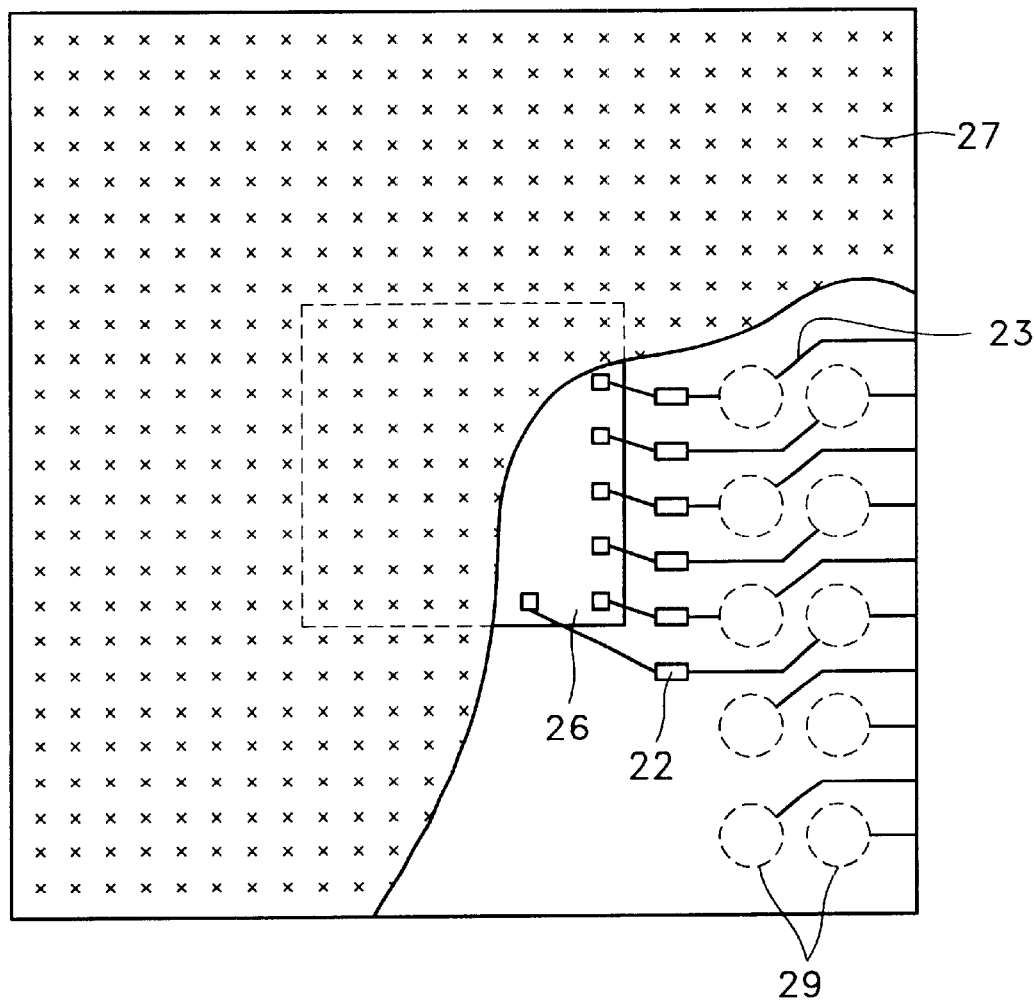
Figure 6:
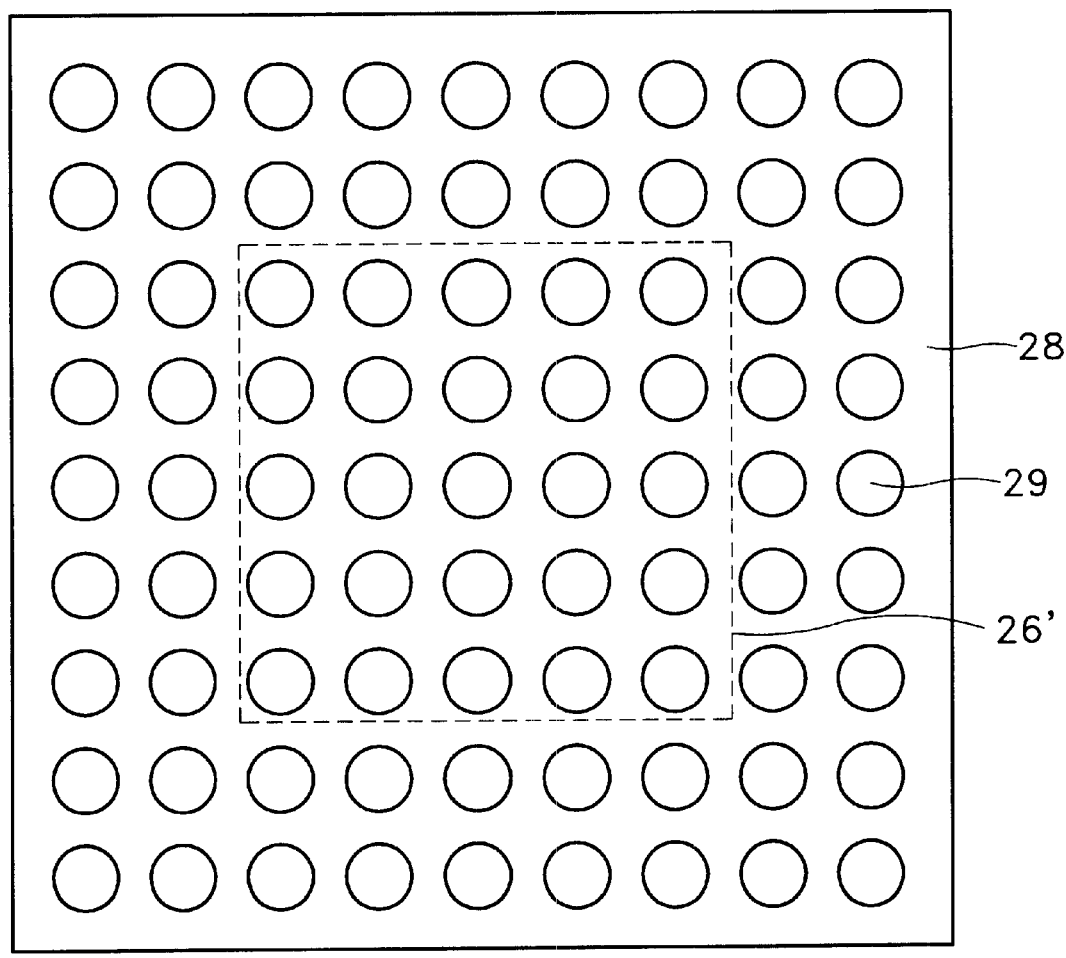
Figure 7:
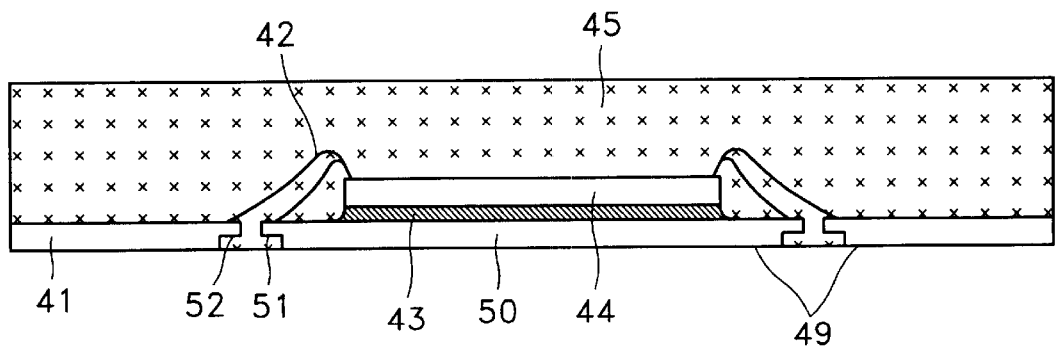
FIGS. 7 through 9 are view illustrating the structure of a conventional quad flat no-lead (QFN) package.
Figure 8:
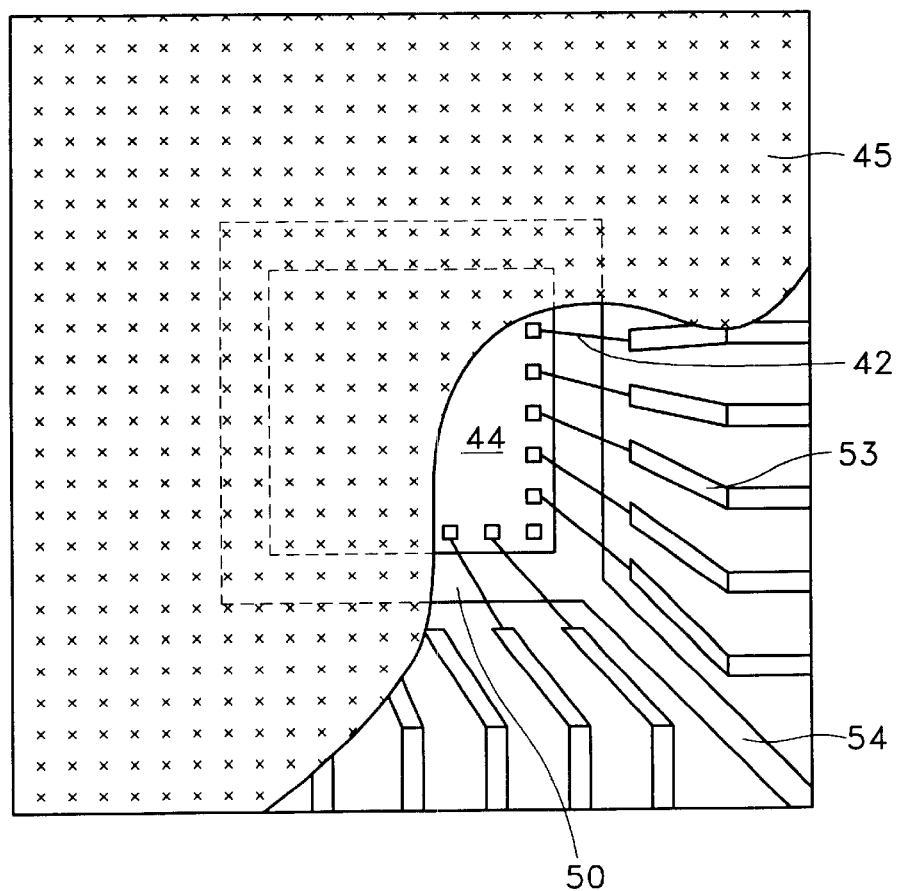
Figure 9:
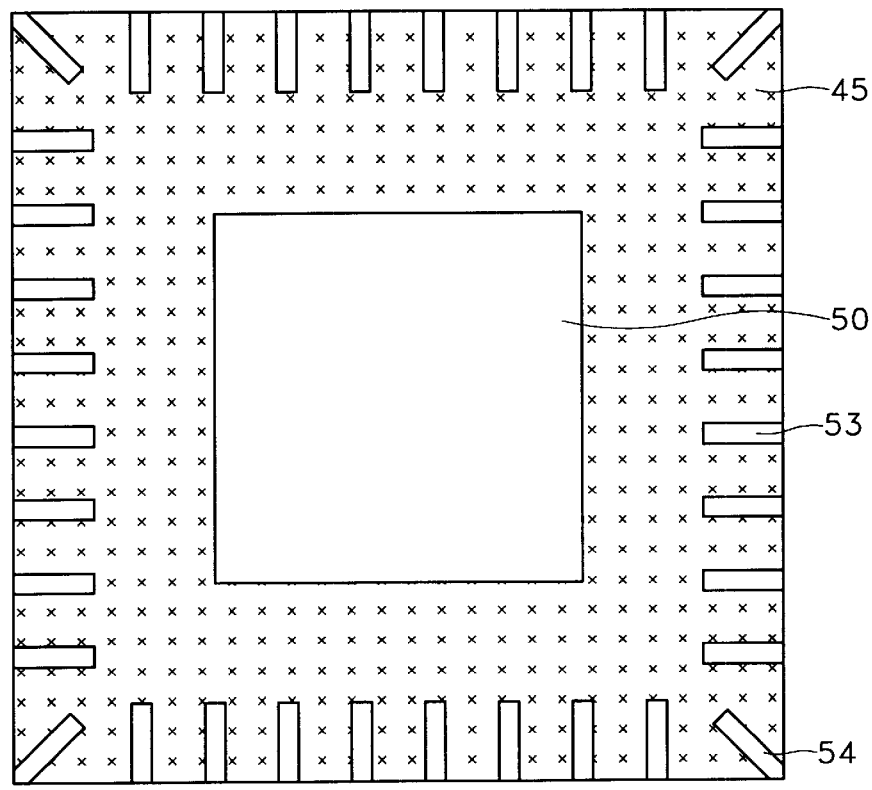
Figure 10:
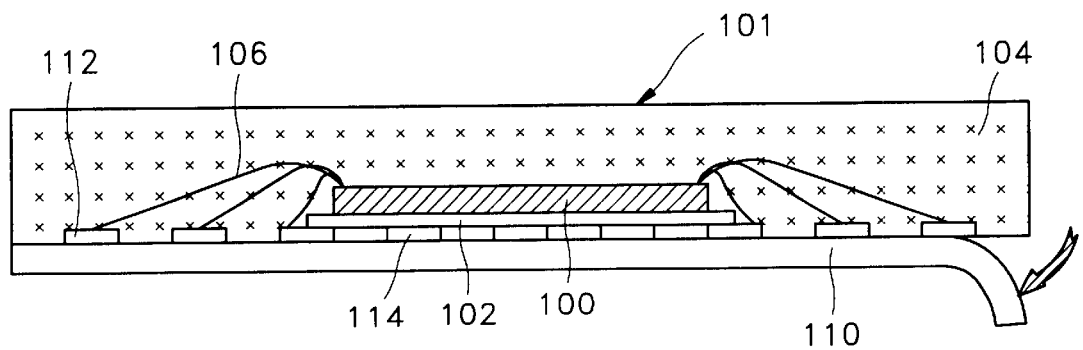
FIGS. 10 and 11 are sectional views for explaining the conceptional structure of a semiconductor package having implantable conductive lands, and a method for manufacturing the same according to the present invention.
Figure 11:
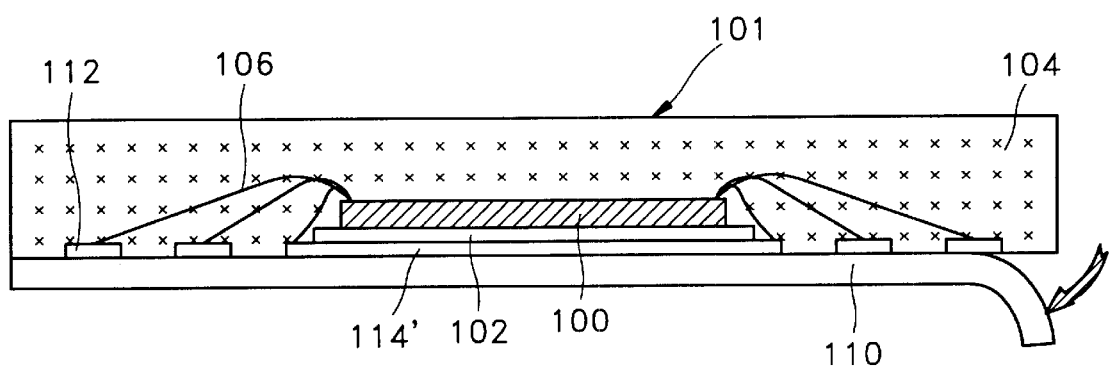

FIGS. 10 and 11 are sectional views for explaining the conceptional structure of a semiconductor package having implantable conductive lands and a method for manufacturing the same according to the present invention. Referring to FIG. 10, the semiconductor package of the present invention includes a semiconductor package body 101 and implantable conductive lands 112 which are attached to the surface of the semiconductor package body 101 to be exposed to the outside and electrically connected to the bond pads, respectively, of a semiconductor chip provided within the semiconductor package body 101.

The shape of the semiconductor package body 101 can be modified into various other shapes depending on the type of semiconductor package. The semiconductor package body 101 fundamentally includes a semiconductor chip 100 and has a structure allowing the semiconductor chip 100 to be connected to the implantable conductive lands 112. An implantable conductive land 112 may serve as usual external connecting terminals for input/output, as ground terminals, as power terminals or as a heat sink 114.

When the bond pads of the semiconductor chip 100 are connected to the implantable conductive lands 112, respectively, through gold wires 106, the bottom of the semiconductor chip 100 is bonded to a grounding implantable conductive land or a heat sink implantable conductive land 114 with a heat conductive or electrically conductive die-bonding epoxy 102. A surface treatment layer (142 of FIG. 14) for wire bonding is preferably formed on one of the sides of each implantable conductive land attached to the semiconductor package body 101. The surface treatment layer is preferably formed of gold, silver, palladium or a compound including gold, silver and palladium. When wire bonding can be accomplished without forming the surface treatment layer, the surface treatment layer may not be formed.

One of the most important features of the present invention is that the implantable conductive lands 112 and 114 are taken off of a tape film 110 according to the present invention and formed on the surface of the semiconductor package body 101. Accordingly, the internal structure of a semiconductor package can be remarkably simplified, and the semiconductor package does not have a rigid substrate, a tape film type substrate or a lead frame.

Referring to FIG. 11, among the implantable conductive lands 112, ground implantable conductive lands and heat sink implantable conductive lands are configured as common type, thus becoming a modified heat sink implantable conductive lands 114'. The following description concerns a method for manufacturing a semiconductor package having implantable conductive lands according to the present invention, with reference to FIG. 11.

A semiconductor chip 100 is bonded to a temporary substrate on which implantable conductive lands 112 are formed on a tape film 110. Here, a die attach process in assembling semiconductor packages may vary with the type of semiconductor package.

For example, in the case of a flip chip package, a solder bump is formed on each bond pad of the semiconductor chip 100, and the solder bump is directly attached to the implantable conductive lands 112 to bond the semiconductor chip 100 to the temporary substrate. Alternatively, in the case of a ball grid array (BGA) package or a quad flat no-lead (QFN) package, the bottom of the semiconductor chip 100 is bonded to the surface of the modified heat sink implantable conductive land 114' with a heat conductive or electrically conductive die-bonding epoxy 102, and an additional wire bonding process for connecting the bond pads of the semiconductor chip 100 to the implantable conductive lands 112, respectively, having surface treatment layers thereon, using gold wires 106, is performed.

Subsequently, the temporary substrate to which the semiconductor chip is bonded is molded using a sealing resin 104, such as an epoxy mold compound (EMC). In the molding process, instead of sealing resin, the liquefied sealing resin 104 may be dispensed to the temporary substrate having the semiconductor chip by a dispenser and then hardened, or a thermosetting sealing resin 104 may be molded using general molding equipment. Consequently, a process from die attaching to molding in manufacturing semiconductor packages may vary with the type of semiconductor package and the type of raw materials used.

Finally, the tape film 110 used as the temporary substrate is taken off the resultant structure obtained after the molding process. The process of taking the tape film 110 off the substrate may be performed immediately after the molding or after a later singulation process.

Figure 12:
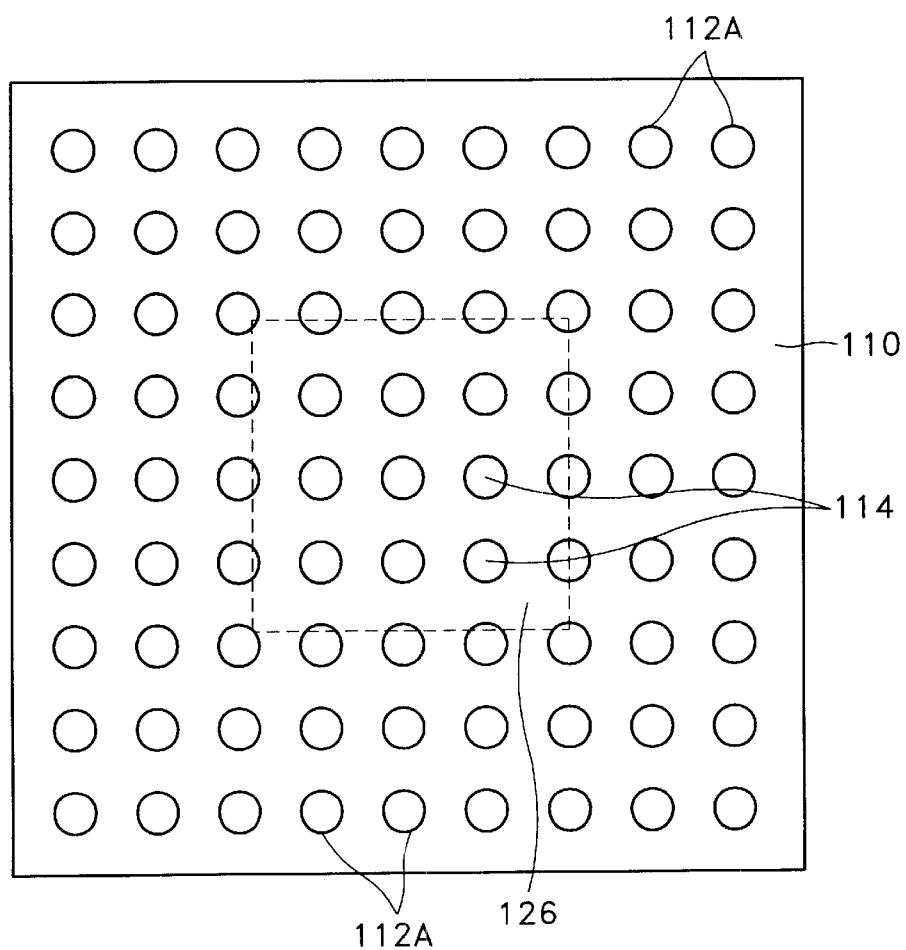
FIGS. 12 and 13 are plan views illustrating the structure of a tape film on which implantable conductive lands used in the present invention are formed.
Figure 13:
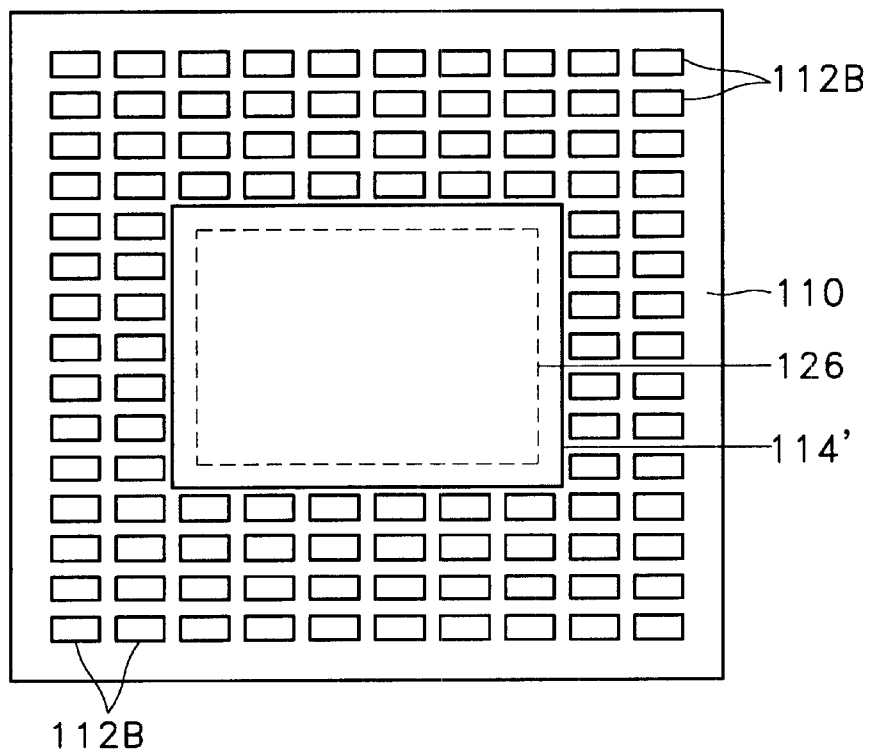

FIGS. 12 and 13 are plan views illustrating the structure of a tape film on which implantable conductive lands used in the present invention are formed. FIG. 12 illustrates the shape of the tape film used in FIG. 10. FIG. 13 illustrates the shape of the tape film used in FIG. 11. In the drawings, reference numeral 112A denotes a circular implantable conductive land for an external connecting terminal serving as an input/output terminal. Reference numeral 112B denotes a rectangular implantable conductive land for an external connecting terminal serving as an input/output terminal. Reference numeral 114 denotes a heat sink implantable conductive land that is not connected to a grounding implantable conductive land. Reference numeral 114' denotes a modified heat sink implantable conductive land that is electrically connected to a grounding implantable conductive land. Reference numeral 126 denotes the area at which a semiconductor chip is bonded.

The implantable conductive lands 112A, 112B, 114 and 114' are formed of copper or an alloy including copper and have a circular or rectangular shape may have any shape allowing wire bonding and attachment of external connecting terminals. The thicknesses of the implantable conductive lands 112A, 112B, 114 and 114' may vary with a user's requirements within a range of several $\mu$m to a several mm.

In FIGS. 12 and 13, a tape film 110 having implantable conductive lands 112A, 112B, 114 and 114' for a single semiconductor package is illustrated, but a strip of a plurality of tape films which have the same shapes as shown in FIGS. 12 and 13, and are provided in horizontal and vertical directions can be designed to be produced by assembly equipment used in manufacturing semiconductor packages.

In manufacturing the tape film 110 having the implantable conductive lands 112A, 112B, 114 and 114', the implantable conductive lands 112A, 112B, 114 and 114' may be formed on the tape film 110 by a photo masking method, by a screen printing method, by picking and placing individual conductive lands and bonding them or by deposition or electric plating.

Figure 14:
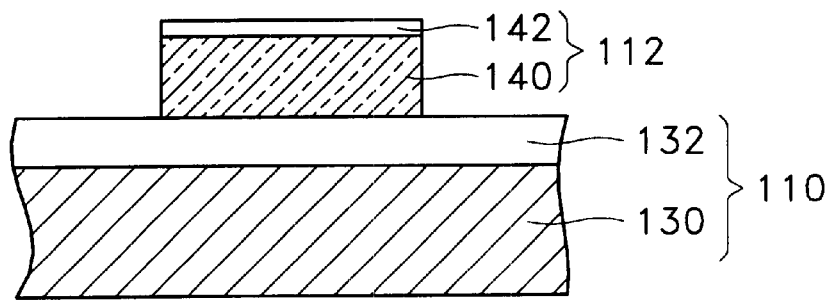
FIG. 14 is a sectional view illustrated for explaining the structure of a tape film on which implantable conductive lands used in the present invention are formed.

FIG. 14 is a sectional view for explaining the structure of a tape film on which implantable conductive lands used in the present invention are formed. The structure of FIG. 14 is composed of an implantable conductive land 112 and a tape film 110. The implantable conductive land 112 is constructed by forming a surface treatment layer 142 for wire bonding on the surface of a conductive land body 140. The tape film 110 is composed of a tape body 130 and an adhesive layer 132 formed on the tape body 130 and facilitating taking off the implantable conductive land 112.

Here, the adhesive layer 132 is an important means allowing the structure of a semiconductor package according to the present invention and a method for manufacturing the same to be realized. In a conventional rigid substrate or a conventional tape film having a via-hole formed by punching or etching, conductive lands and an insulation substrate are permanently laminated using an epoxy such as a phenol base or a polyimide base so that they are not easily taken off, because delamination of conductive lands from a substrate results in fatal defects in manufacturing semiconductor packages.

However, the adhesive layer 132 in the tape film 110 according to the present invention is used based on an idea upon different from the idea which a conventional adhesive layer is used. In otherwords, since the tape film 110 is supposed to be easily taken off a semiconductor package body after a molding process in the present invention, the adhesive layer 132 is formed of a silicone-based adhesive instead of a phenol or polyimide epoxy, so that only the tape film 110 is taken off the semiconductor package body leaving the implantable conductive lands 112 as they are, as shown in FIGS. 10 and 11, when the top of the implantable conductive land 112 is fixed to a semiconductor package body due to the force of wire bonding and the adhesive force of molding after the molding process.

The tape body 130 in the tape film 110 may be formed of an any material having resistivity against heat, pressure and chemicals produced during die bonding, wire bonding and molding in manufacturing semiconductor packages. In other words, paper, polymer such as polyimide, metal or a compound including paper, polymer and metal may be used.

Since a tape film on which implantable conductive lands used in the present invention are formed has a simple structure and is not required to be sophisticated like a conventional rigid substrate or a substrate having via-holes formed by punching or etching, it can be manufactured at low cost. Accordingly, the present invention can considerably reduce the cost in assembling semiconductor packages, compared to conventional technology where an expensive rigid substrate or lead frame is used.

Figure 15:
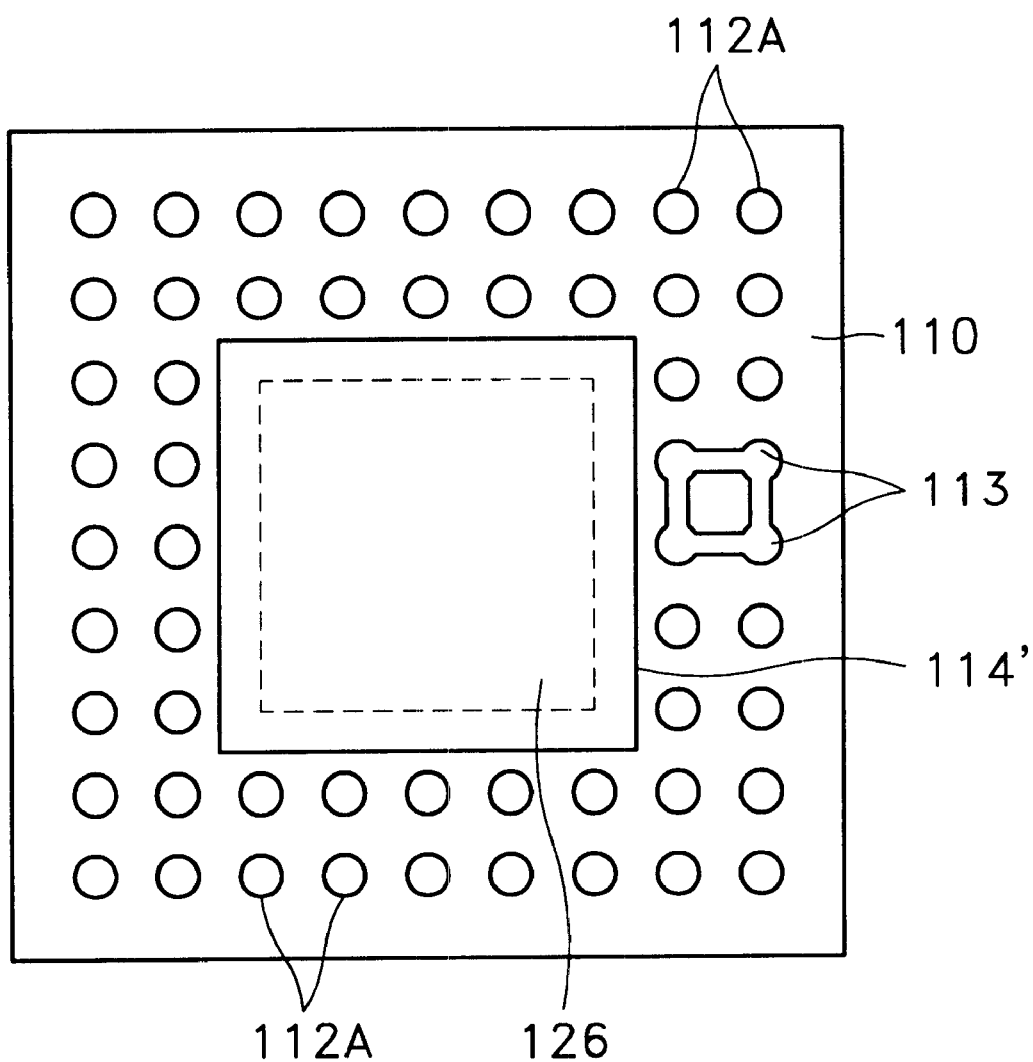
FIG. 15 is a plan view illustrated for explaining the transformed shape of an implantable conductive land on a tape film on which implantable conductive lands used in the present, invention are formed.

FIG. 15 is a plan view for explaining the transformed shape of an implantable conductive land on a tape film on which implantable conductive lands used in the present invention are formed. Referring to FIG. 15, among the implantable conductive lands 112A, implantable conductive lands 113 serving as power terminals are connected, thereby forming an implantable conductive land in which power terminals are connected. This stabilizes the power terminals in a semiconductor package. In this embodiment, four terminals are integrated into one, but it is apparent that various modifications can be made.

First Embodiment: BGA Package

Figure 16:
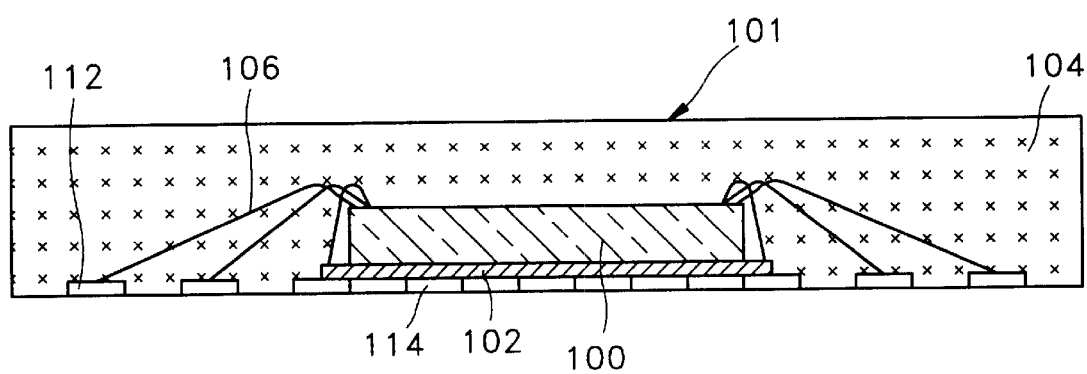
FIGS. 16 through 22 are views illustrating the structure of a semiconductor package according to a first embodiment of the present invention and a method for manufacturing the same.

FIGS. 16 through 22 are views illustrating the structure of a semiconductor package according to a first embodiment of the present invention, and a method for manufacturing the same. Referring to FIG. 16, the semiconductor package according to the first embodiment of the present invention includes a semiconductor chip 100, a semiconductor package body 101 including a heat conductive or electrically conductive die-bonding epoxy 102, for bonding the bottom of the semiconductor chip 100, gold wires 106 and a sealing resin 104 of an epoxy mold compound, and implantable conductive lands 112 including heat sink implantable conductive lands 114.

The gold wires 106 connect the implantable conductive lands 112 to the respective bond pads of the semiconductor chip 100. The heat conductive or electrically conductive die-bonding epoxy 102 directly bonds the semiconductor chip 100 to the heat sink implantable conductive lands 114.

Figure 17:
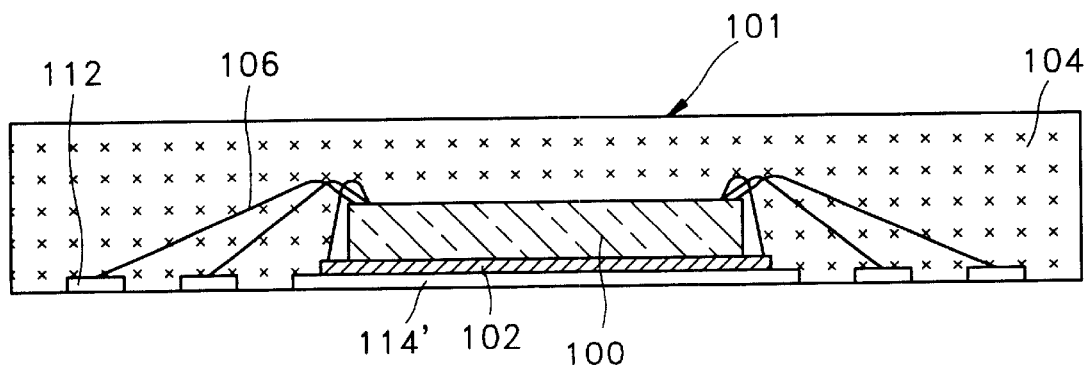

The structure of a semiconductor package illustrated in FIG. 17 is the same as that illustrated in FIG. 16, with the exception that heat sink conductive lands among the implantable conductive lands are integrated into a single modified heat sink implantable conductive land 114', and thus the foregoing description will not be repeated. The modified heat sink implantable conductive land 114' has a structure allowing heat generated from the semiconductor chip 100 to be effectively discharged to the outside. In addition, the thickness of the modified heat sink implantable conductive land 114' can be adjusted when necessary.

Figure 18:
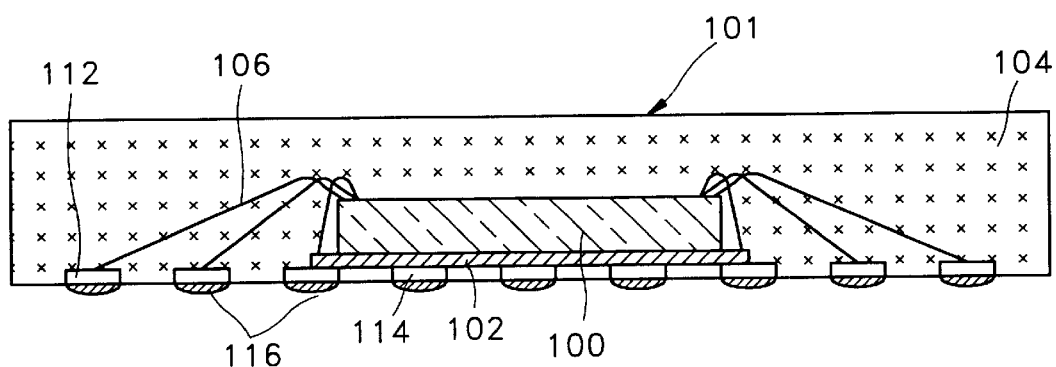
Figure 19:
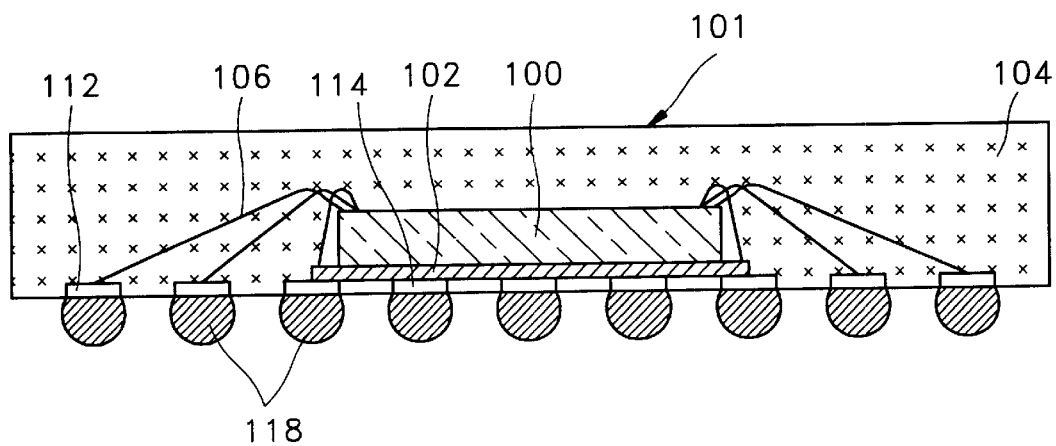

Referring to FIGS. 18 and 19, a semiconductor package according to the present invention may further include external connecting terminals connected to the heat sink implantable conductive lands 114 and the input/output implantable conductive lands 112. Each of the external connecting terminals may be formed as a solder coat 116, as shown in FIG. 18, or as a solder ball 118, as shown in FIG. 19.

Figure 20:
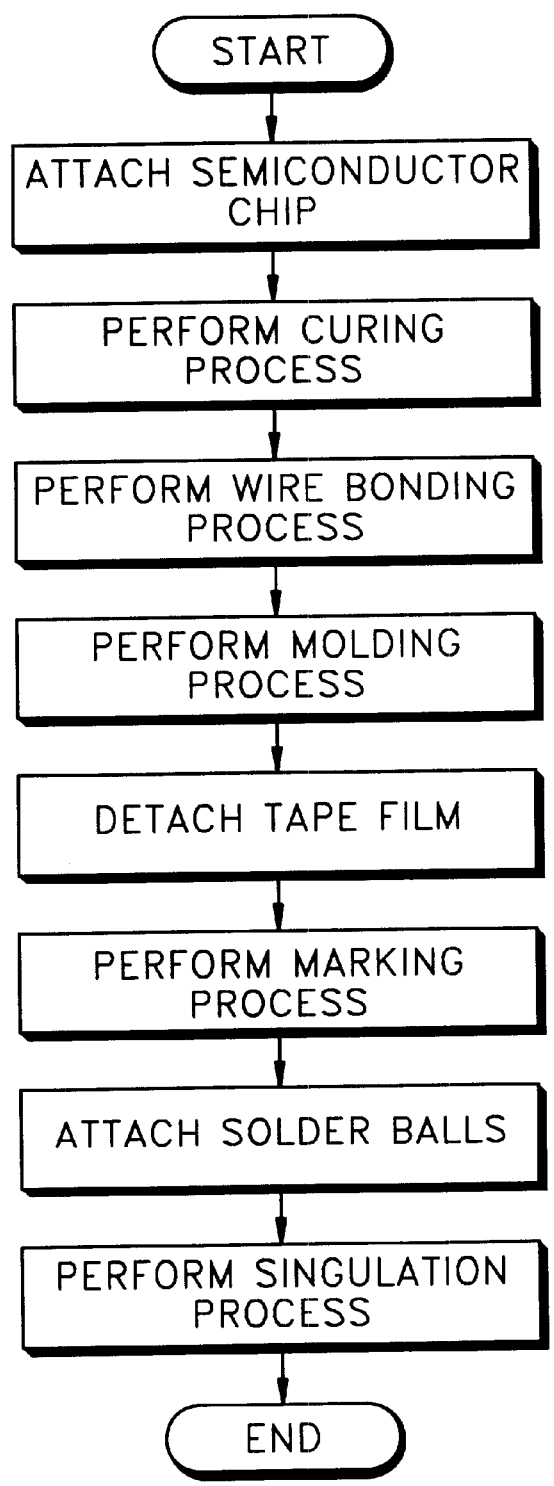

FIG. 20 is a flowchart illustrating a method of manufacturing a semiconductor package including implantable conductive lands according to the first embodiment of the present invention. Referring to FIG. 20, a semiconductor chip obtained after a sawing process is attached to a tape film (110 of FIG. 13) on which implantable conductive lands are formed according to the present invention. A heat conductive or electrically conductive die-bonding epoxy is preferably used for attachment of the semiconductor chip. The semiconductor chip is preferably attached to a portion where a modified heat sink implantable conductive land (114' of FIG. 13) is disposed. Subsequently, a curing process is performed to remove a volatile material from the die-bonding epoxy and harden the die-bonding epoxy.

Next, a wire bonding process for electrically connecting each bond pad of the semiconductor chip to an implantable conductive land is performed. Here, a surface treatment layer is preferably formed on the surface of each implantable conductive land for wire bonding.

The resultant structure obtained after the wire bonding process is molded by molding equipment using a sealing resin. The mold preferably has a simple one cavity type shape with flat surfaces rather than has a conventional shape having a plurality of cavities. Accordingly, the cost for molding equipment can be saved.

Next, the tape film is detached from a semiconductor package body after completion of the molding. Here, the implantable conductive lands are not detached but are fixed to the semiconductor package body due to the adhesive force of the molding, the adhesive force of the die-bonding epoxy and the adhesive force of the wire bonding. A marking process using a laser is performed on the resultant structure obtained after the removal of the tape film, and then solder balls used as external connecting terminals are attached to the exposed bottoms of the implantable conductive lands. Thereafter, a singulation process of taking individual semiconductor packages off a strip of the semiconductor packages is performed.

Figure 21:
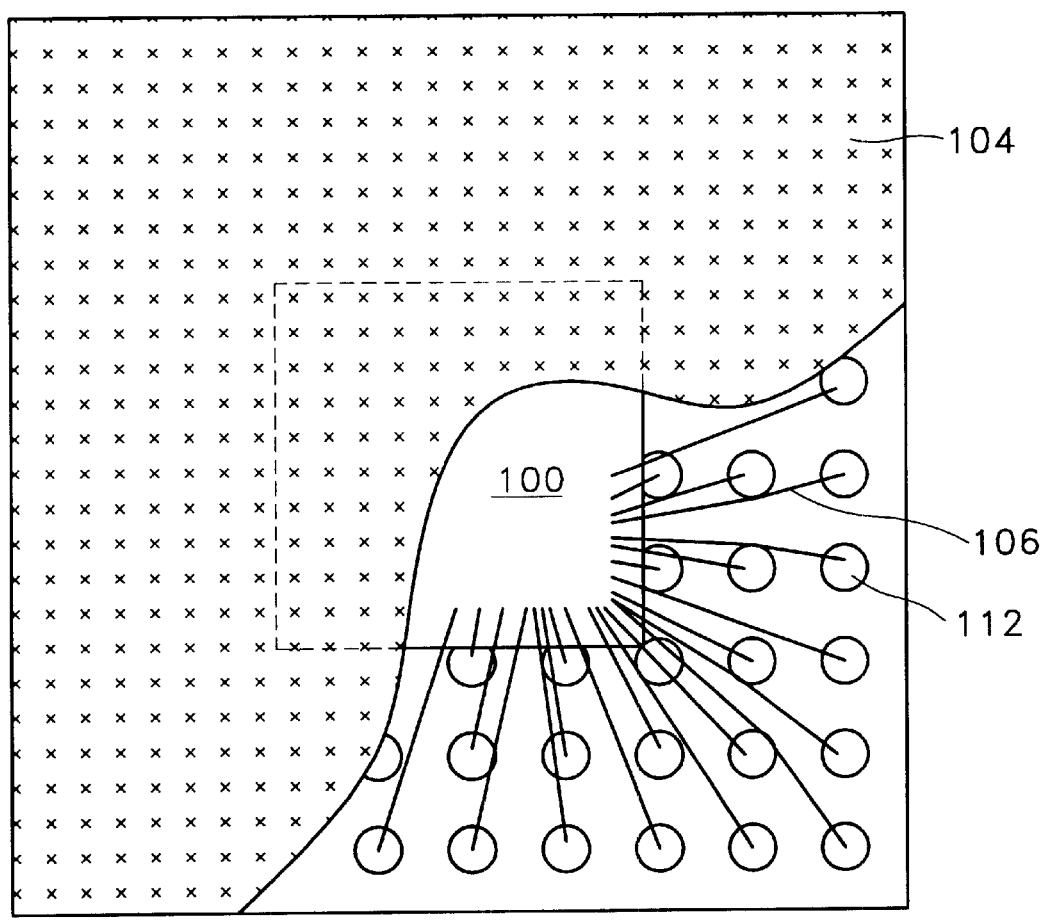
Figure 22:
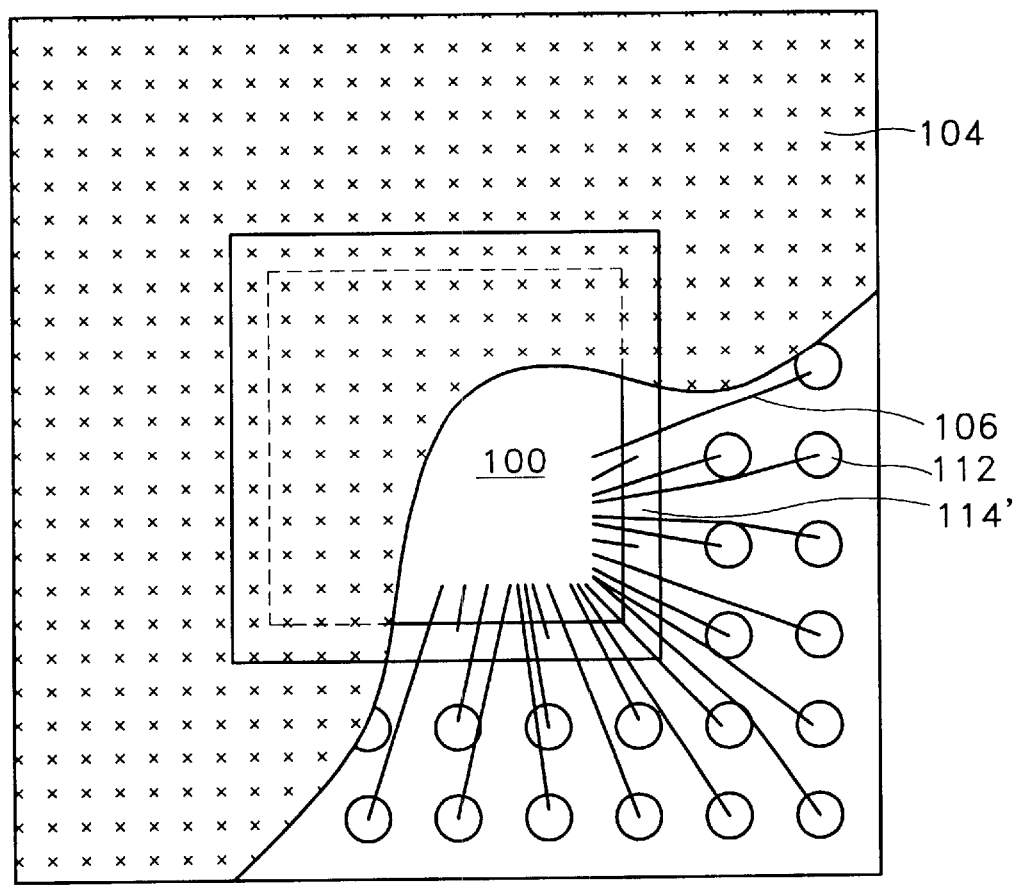

FIGS. 21 and 22 are partially cut-away plan views illustrating semiconductor packages including implantable conductive lands, which are completed by the manufacturing method described above. FIG. 21 illustrates a type of semiconductor package where heat sink implantable conductive lands are not connected to each other, as shown in FIG. 16, and FIG. 22 illustrates a type of semiconductor package where heat sink implantable conductive lands are connected and integrated into a single modified heat sink implantable conductive land 114', as shown in FIG. 17. In the drawings, reference numeral 104 denotes sealing resin, and reference numeral 106 denotes gold wire.

Second Embodiment: QFN Package

FIGS. 23 through 28 are views illustrating the structure of a semiconductor package according to a second embodiment of the present invention and a method for manufacturing the same.

Figure 23:
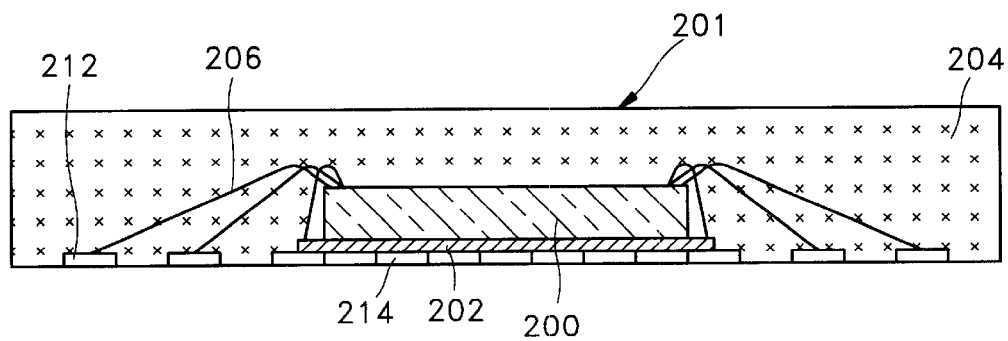
FIGS. 23 through 28 are views illustrating the structure of a semiconductor package according to a second embodiment of the present invention and a method for manufacturing the same.
Figure 24:
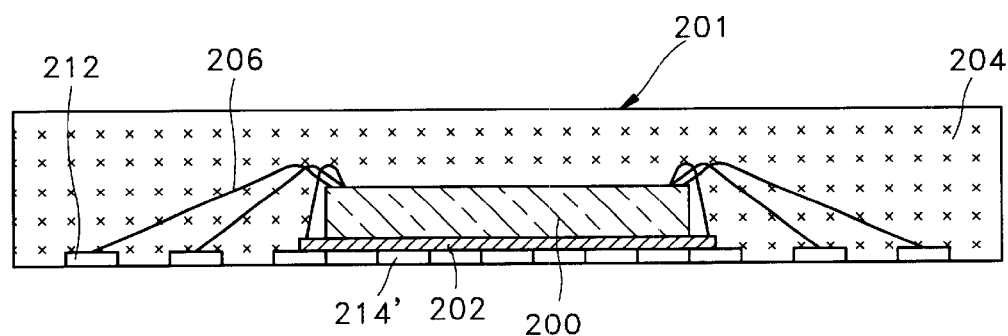
Figure 25:
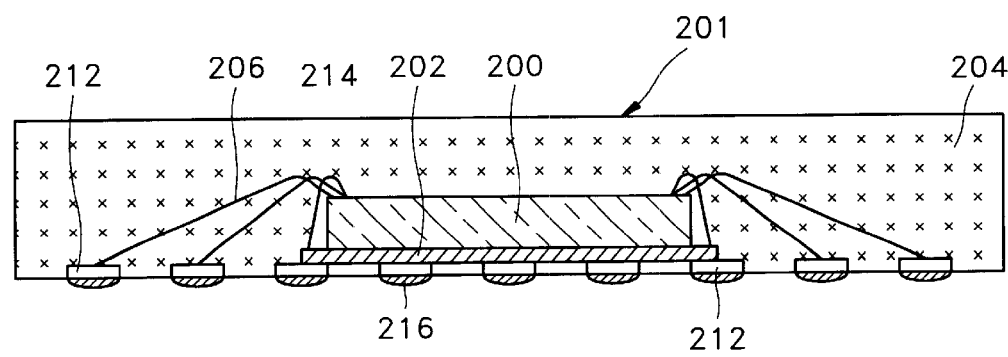

Referring to FIGS. 23 through 25, since the present invention uses a tape film including implantable conductive lands instead of a conventional lead frame, the structure of a QFN type semiconductor package is almost the same as that of the first embodiment, and thus a description thereof will be omitted. For clear understanding, last digits of the reference numerals are set to correspond to those used in the first embodiment.

Figure 26:
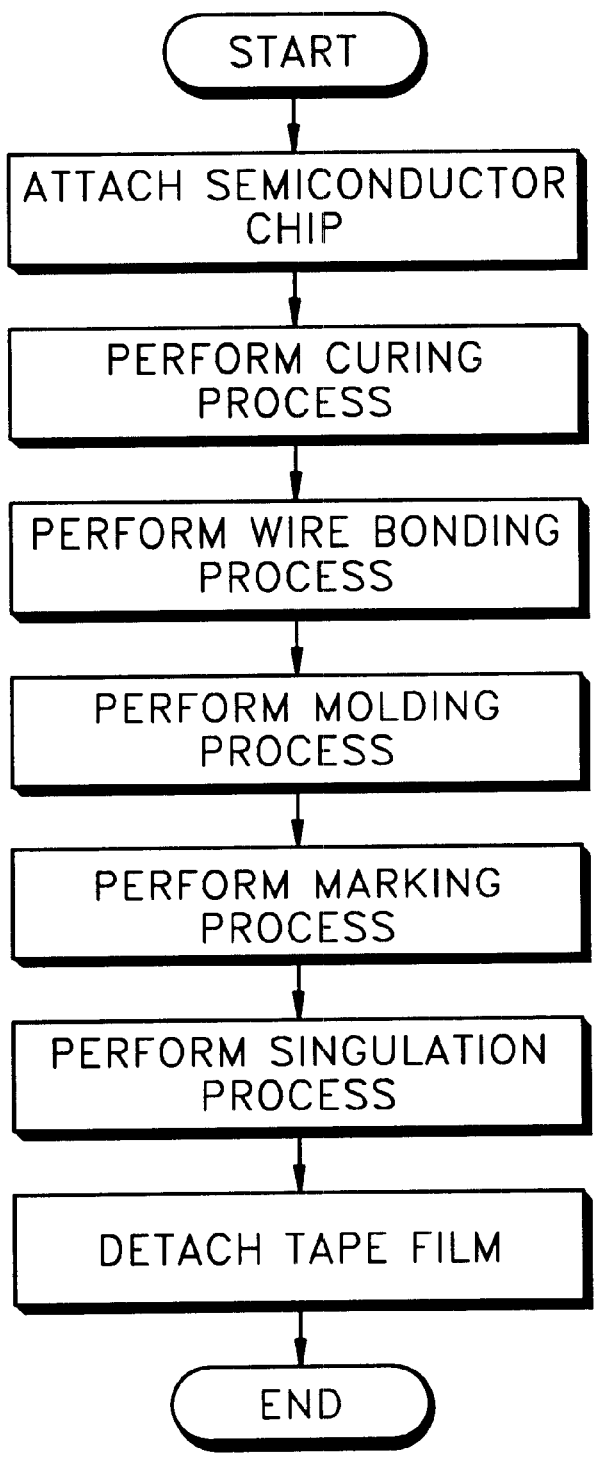

FIG. 26 is a flowchart illustrating a method of manufacturing a semiconductor package including implantable conductive lands according to the second embodiment of the present invention. Referring to FIG. 26, a die bonding process and a wire bonding process are performed in the same manner as in the first embodiment. Next, a die-bonding epoxy is hardened while a volatile material contained in the die-bonding epoxy is removed by a curing process. Subsequently, a molding process, a marking process and a singulation process are sequentially performed by typical methods. Finally, a tape film is detached from a semiconductor package body after the singulation process. The second embodiment is different from the first embodiment in that the process of detaching the tape film is performed after the singulation process not after the molding process.

Compared to a conventional method using a lead frame, since a semiconductor package according to the present invention does not include a lead frame, it is easy to cut a strip of semiconductor packages into individual semiconductor packages in the singulation process, and the positions of input/output terminals within a semiconductor package can be easily designed even if a large number of input/output terminals are used.

Figure 27:
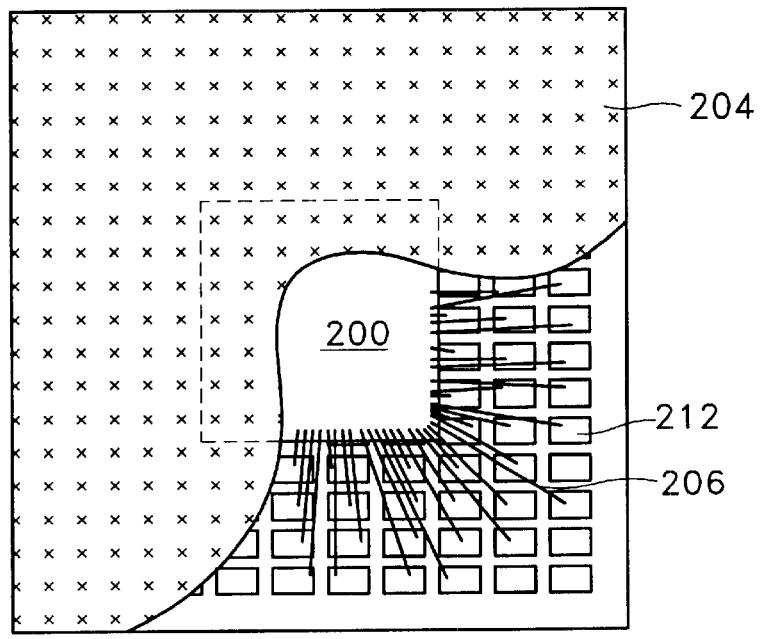
Figure 28:
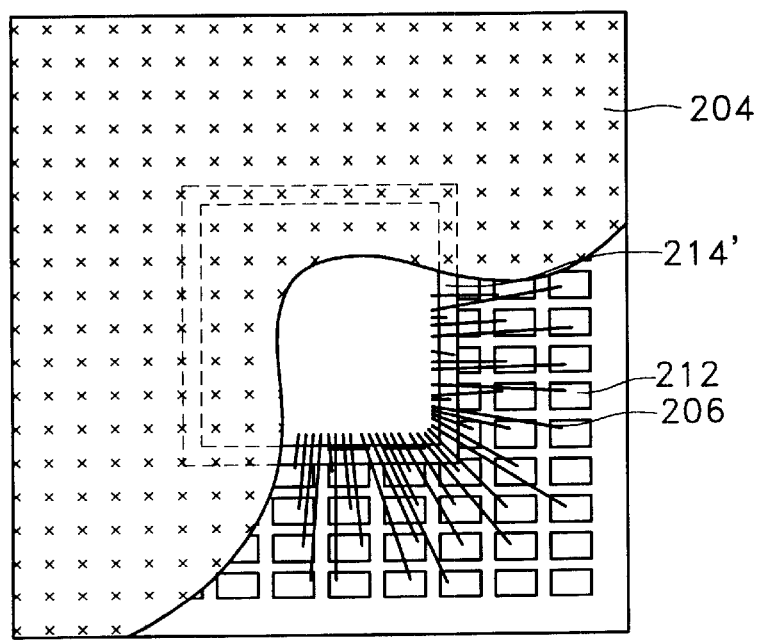

FIG. 27 is a partially cut-away plan view illustrating a type of semiconductor package where heat sink implantable conductive lands are not connected to each other, as shown in FIG. 23. FIG. 28 is a partially cut-away plan view illustrating a type of semiconductor package where heat sink implantable conductive lands are connected and integrated into a single one, as shown in FIG. 24. In the drawings, reference numeral 204 denotes sealing resin, reference numeral 206 denotes gold wire and reference numeral 212 denotes input/output implant conductive lands.

Third Embodiment: Flip Chip Package

FIGS. 29 through 34 are views illustrating the structure of a semiconductor package according to a third embodiment of the present invention and a method for manufacturing the same.

Figure 29:
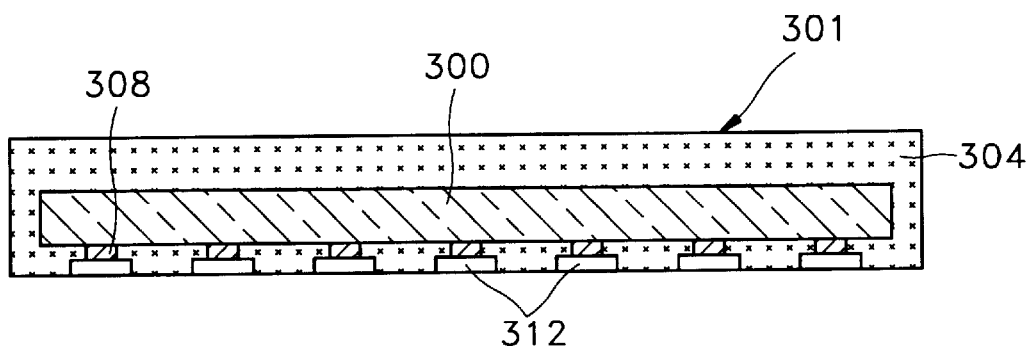
FIGS. 29 through 34 are views illustrating the structure of a semiconductor package according to a third embodiment of the present invention and a method for manufacturing the same.

FIG. 29 is a sectional view illustrating the structure of a semiconductor package including implantable conductive lands according to the third embodiment of the present invention. A semiconductor package according to the third embodiment of the present invention is composed of a semiconductor package body 301 and implantable conductive lands 312, like the first and second embodiments. However, the internal shape of the semiconductor package body 301 is different from those of the first and second embodiments. In other words, the semiconductor package of the third embodiment does not include gold wires and die-bonding epoxy. A solder bump 308 protruding from each bond pad of a semiconductor chip 300 is provided to be directly connected to an implantable conductive land 312.

Figure 30:
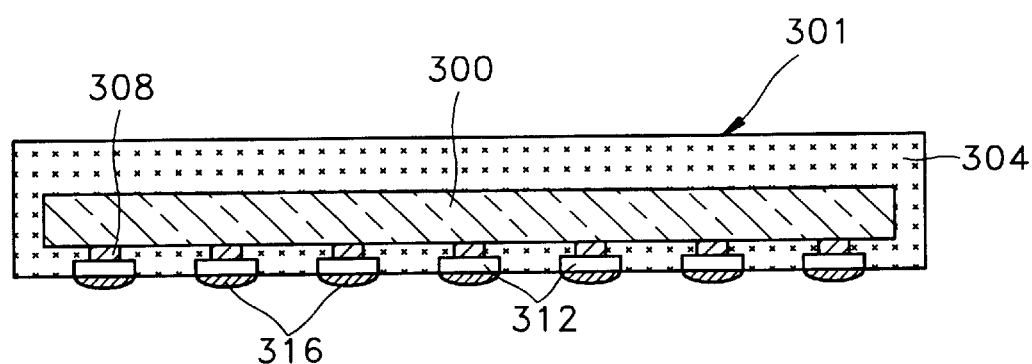
Figure 31:
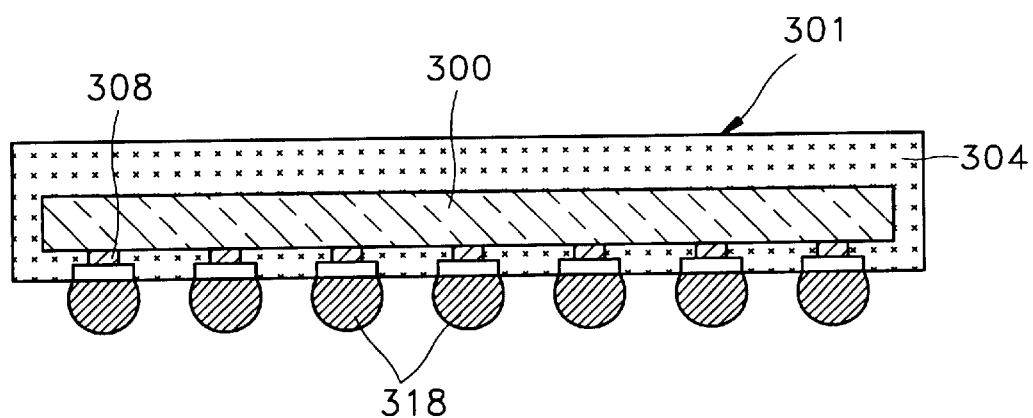

Referring to FIGS. 30 and 31, a semiconductor package according to the third embodiment of the present invention may further include an external connecting terminal connected to each implantable conductive land 312. Each external connecting terminal may be formed using a solder coat 316 of FIG. 30 or a solder ball 318 of FIG. 31.

Figure 32:
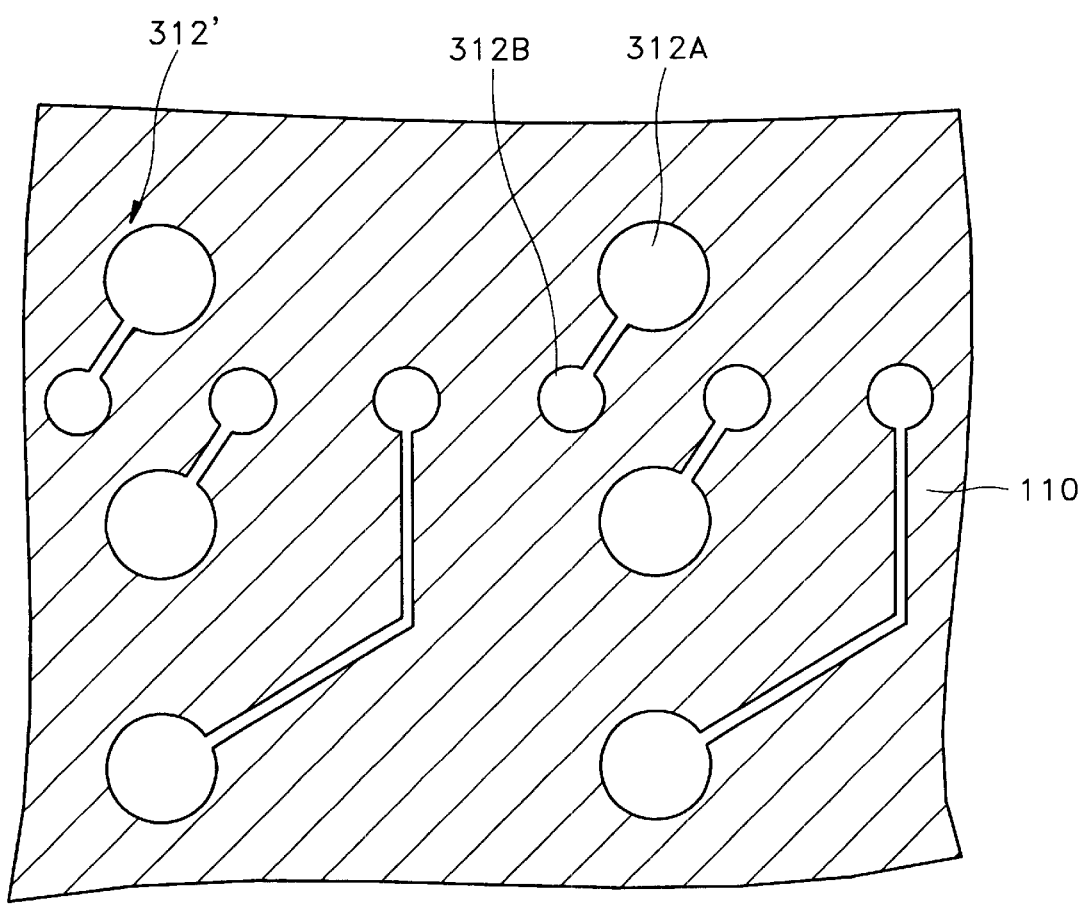

FIG. 32 is a plan view illustrating a tape film including implantable conductive lands that are extended. Referring to FIG. 32, an extended implantable conductive land 312' can be used when the gap between bond pads formed on a semiconductor chip is narrow. The extended implantable conductive land 312' includes a portion 312B connected to a solder bump and a portion 312A connected to an external connecting terminal, and these two portions are connected through a wire. Accordingly, the implantable conductive land 312' can be extended from a portion connected to a solder pump to a portion connected to an external connecting terminal. In the drawing, reference numeral 110 denotes a tape film.

Figure 33:
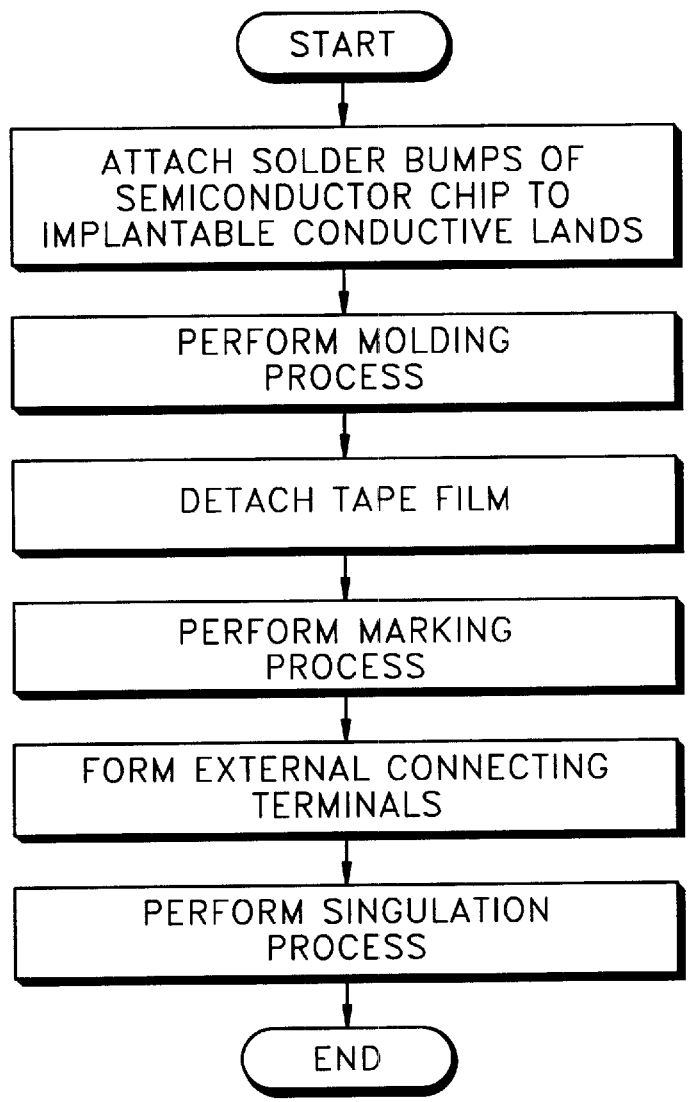
Figure 34:
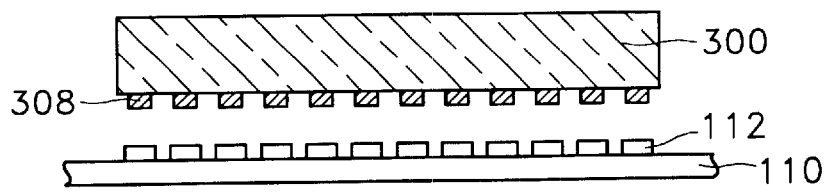

FIG. 33 is a flowchart illustrating a method for manufacturing a semiconductor package having implantable conductive lands according to the third embodiment of the present invention. FIG. 34 is a sectional view illustrating how a semiconductor chip is bonded to a tape film having implantable conductive lands.

Referring to FIGS. 33 and 34, a protruding solder bump 308 is formed on each bond pad of a semiconductor chip 300, and unlike the first and second embodiments, the semiconductor chip is turned upside down and bonded to a tape film 110 having implantable conductive lands 112. Subsequently, a molding process is performed using a sealing resin, an epoxy mold compound, and then the tape film 110 is detached from a temporary substrate. Thereafter, a marking process, a process for attachment of solder balls used as external connecting terminals and a singulation process are sequentially performed by typical methods, thereby completing semiconductor packages.

According to the present invention, firstly, the cost for assembling semiconductor packages can be reduced. Since the present invention does not use expensive substrates or lead frames, the cost for assembling semiconductor packages can be reduced. In addition, since conventional production facilities can be used without modification, additional investment for facilities is not necessary. The manufacturing processes can also be simplified. For example, when a solder coat used as an external connecting terminal is formed on a surface opposite to a surface having a surface treatment layer thereon, in each implantable conductive land, in advance, a process of forming external connecting terminals can be removed. In another example, if instead of a flat one cavity type mold, a mold having cavities is used during a molding process, a later singulation process can be removed. In addition, since the manufacturing processes can be easily performed, the cost for assembling semiconductor packages can be lowered. In other words, a QFN package according to the present invention does not include a raw material such as a lead frame which is hard to cut so that defects formed during a singulation process can be decreased. Moreover, a conventional mold having a plurality of cavities is not necessarily used, and a flat one cavity type mold can be used, thereby facilitating a molding process.

Secondly, the performance of a semiconductor package can be improved. Since a heat sink implantable conductive land according to the present invention is directly connected to a semiconductor chip and exposed to the outside, the thermal characteristics of a semiconductor package can be improved. In addition, an intermediate connecting terminal such as a via-hole or a circuit pattern used in conventional technology is not used, and thus the length of a wire connecting a bond pad to an external connecting terminal can be shortened, thereby improving the electrical characteristics of a semiconductor package. Moreover, since neither a rigid substrate, a tape film type substrate nor a lead frame is formed within a semiconductor package, the thickness of a semiconductor package can be decreased, thereby improving the mechanical characteristics of the semiconductor package.

Finally, the reliability of a semiconductor package can be improved. More specifically, a delamination problem caused by forming many layers within a semiconductor package can be prevented, and process defects caused by differences between thermal expansive coefficients of a substrate or a lead frame and other parts within a semiconductor package can be decreased. In addition the manufacturing processes of semiconductor packages are simple and easy, thereby improving the reliability of semiconductor packages.

Although the invention has been described with reference to particular embodiments, it will be apparent to one of ordinary skill in the art that modifications to the described embodiments may be made without departing from the spirit and scope of the invention.

What is claimed is:

1. A semiconductor package having implantable conductive lands, the semiconductor package comprising:
 a semiconductor package body including a semiconductor chip with a plurality of bond pads but not including a lead frame or a substrate therewith, the semiconductor package body formed of a sealing resin; and
 implantable conductive lands attached to the surface of the semiconductor package body to be exposed to the outside, each of the implantable conductive lands electrically connected to a bond pad of the semiconductor chip,
 wherein said implantable conductive lands are formed using a method selected from a group consisting of screen printing, pick & placing and bonding, deposition, and electroplating.

2. The semiconductor package of claim 1, wherein the implantable conductive lands are detached from a tape film serving as a substrate until a molding process is completed.

3. The semiconductor package of claim 1, wherein the thickness of each implantable conductive land is between several $\mu$m and several mm, and the shape thereof is one of a tetragon and a circle.

4. The semiconductor package of claim 1, wherein among the implantable conductive lands, those that serve as grounding terminals or heat sinks are electrically connected to each other.

5. The semiconductor package of claim 1, wherein among the implantable conductive lands, those that serve as power terminals are electrically connected to each other.

6. The semiconductor package of claim 1, further comprising external connecting terminals attached to the implantable conductive lands.

7. The semiconductor package of claim 6, wherein the external connecting terminals are solder coats or solder balls.

8. The semiconductor package of claim 1, wherein the semiconductor package body is one of a ball grid array (BGA) type and a quad flat no-lead (QFN) type.

9. The semiconductor package of claim 8, wherein the implantable conductive lands are connected to the bond pads of the semiconductor chip through wires.

10. The semiconductor package of claim 8, wherein a surface treatment layer for wire bonding is formed on one side of each implantable conductive land attached to the semiconductor package body.

11. The semiconductor package of claim 8, wherein the bottom of the semiconductor chip is attached to implantable conductive lands using a heat conductive die-bonding epoxy or an electrically conductive die-bonding epoxy.

12. The semiconductor package of claim 1, wherein the semiconductor package body is a flip chip type.

13. The semiconductor package of claim 12, wherein a solder bump is formed on each bond pad of the semiconductor chip.

14. The semiconductor package of claim 12, wherein an implantable conductive land connected to a solder bump is connected to an implantable conductive land connected to an external connecting terminal through a wire, thereby forming an extended implantable conductive land.

* * * * *